(12) United States Patent
Cho et al.

(10) Patent No.: US 11,114,620 B2
(45) Date of Patent: Sep. 7, 2021

(54) ORGANIC LIGHT-EMITTING DIODE DEVICE AND COMPOUND FOR CHARGE GENERATION LAYER INCLUDED THEREIN

(71) Applicant: Samsung Display Co., Ltd., Yongin-si (KR)

(72) Inventors: Yoonhyeung Cho, Yongin-si (KR); Hyungseok Jang, Hwaseong-si (KR); Dongchan Kim, Gunpo-si (KR); Wonjong Kim, Suwon-si (KR); Jiyoung Moon, Gwangju-si (KR); Yeongrong Park, Osan-si (KR); Dongkyu Seo, Suwon-si (KR); Myungchul Yeo, Asan-si (KR); Jihye Lee, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 350 days.

(21) Appl. No.: 16/206,969

(22) Filed: Nov. 30, 2018

(65) Prior Publication Data
US 2019/0288212 A1    Sep. 19, 2019

(30) Foreign Application Priority Data
Mar. 13, 2018  (KR) .................. 10-2018-0029112

(51) Int. Cl.
*H01L 51/50*  (2006.01)
*H01L 51/00*  (2006.01)
*C07F 5/02*   (2006.01)
*H01L 51/52*  (2006.01)

(52) U.S. Cl.
CPC .......... *H01L 51/0051* (2013.01); *C07F 5/025* (2013.01); *H01L 51/008* (2013.01); *H01L 51/5044* (2013.01); *H01L 51/5278* (2013.01)

(58) Field of Classification Search
None
See application file for complete search history.

(56) References Cited

U.S. PATENT DOCUMENTS

| 9,074,128 B2 | 7/2015 | Stoessel et al. |
| 9,673,406 B2 | 6/2017 | Kwong et al. |
| 2006/0081840 A1* | 4/2006 | Mori ............. H01L 51/5088 257/40 |

(Continued)

FOREIGN PATENT DOCUMENTS

| KR | 10-2015-0064517 A | 6/2015 |
| KR | 10-2017-0024162 A | 3/2017 |

(Continued)

*Primary Examiner* — Gregory D Clark
(74) *Attorney, Agent, or Firm* — Lewis Roca Rothgerber Christie LLP

(57) ABSTRACT

Disclosed is an organic light-emitting diode device including: a first electrode; a second electrode disposed opposite to the first electrode; m light-emitting units (where m is an integer of 2 or more) disposed between the first electrode and the second electrode, and including at least one light-emitting layer; and m-1 charge generation layers each interposed between two adjacent light-emitting units of the m light-emitting units; wherein at least one of the m-1 charge generation layers includes a compound for a charge generation layer, which includes a boron-containing compound bonded to a metal halide by a one-electron sigma bond.

20 Claims, 3 Drawing Sheets

(56) References Cited

U.S. PATENT DOCUMENTS

| | | | |
|---|---|---|---|
| 2015/0155513 | A1 | 6/2015 | Pieh et al. |
| 2017/0186987 | A1 | 6/2017 | Shin et al. |
| 2017/0221969 | A1 | 8/2017 | Steckel et al. |
| 2017/0263876 | A1 | 9/2017 | Kim et al. |
| 2017/0294587 | A1 | 10/2017 | Kim et al. |

FOREIGN PATENT DOCUMENTS

| | | |
|---|---|---|
| KR | 10-2017-0106564 A | 9/2017 |
| KR | 10-2017-0116301 A | 10/2017 |
| KR | 10-1842719 B1 | 3/2018 |

* cited by examiner

ORGANIC LIGHT-EMITTING DIODE DEVICE AND COMPOUND FOR CHARGE GENERATION LAYER INCLUDED THEREIN

CROSS-REFERENCE TO RELATED APPLICATION

This application claims priority to and the benefit of Korean Patent Application No. 10-2018-0029112, filed on Mar. 13, 2018, in the Korean Intellectual Property Office (KIPO), the entire content of which is incorporated herein by reference.

BACKGROUND

1. Field

Exemplary embodiments of the present disclosure relate to an organic light-emitting diode device having low driving voltage, high efficiency, and long lifespan characteristics, and a compound for a charge generation layer included in the device, which has excellent charge-generation ability and charge-transfer ability.

2. Discussion of Related Art

An organic light-emitting display device is a self-luminescent display device that displays images by means of a plurality of organic light-emitting diodes configured to emit light. This organic light-emitting display device exhibits characteristics, such as low power consumption, high luminance, and high response speed, and is thus currently attracting attention as a display device.

Generally, an organic light-emitting diode includes an anode and a cathode disposed opposite to each other, and at least one organic light-emitting layer disposed between the anode and the cathode. The organic light-emitting diode device uses the principle that holes and electrons generated from the anode and the cathode, respectively, are injected into the organic light-emitting layer and combine to generate excitons and light is emitted when the excitons decay (e.g., transition or relax) to a ground state. The organic light-emitting diode device may include, in addition to the organic light-emitting layer disposed between the anode and the cathode, a hole transport layer, an electron injection layer, an electron transport layer, etc.

Such light-emitting devices are classified, according to a method of configuring the organic light-emitting layer, into a single type (or single kind) of light-emitting device including a single organic light-emitting layer, and a tandem type (or tandem kind) of light-emitting device including two or more organic light-emitting layers arranged in a tandem configuration. Among them, the tandem-type (or tandem kind) of organic light-emitting diode device has features relative to the single type (or single kind) of organic light-emitting diode device in terms of increased efficiency, high stability, a long lifespan and the like, and thus may be used in display devices or lighting devices which require high luminance and a long lifespan. To realize this tandem-type (or tandem kind) of organic light-emitting diode device, a charge generation layer (CGL) that couples (or connects) two or more organic light-emitting layers is present in the device.

However, a conventional charge generation layer is problematic in that it increases the driving voltage of the tandem-type (or tandem kind) of light-emitting device by about 1.3-2 times or more compared to that of a conventional single-type (or single kind) of organic light-emitting diode device due to its poor ability to generate and transfer charges, thus reducing the power efficiency and lifespan of the organic light-emitting diode device. To solve this problem, it is important to select materials and elements so that electron tunneling at the interface is possible.

SUMMARY

Exemplary embodiments of the present disclosure are directed to an organic light-emitting diode device having low driving voltage, high efficiency, and long lifespan characteristics by including a charge generation layer having an excellent ability to generate and transfer charges.

According to an exemplary embodiment of the present disclosure, there is provided an organic light-emitting diode device including: a first electrode; a second electrode disposed opposite to the first electrode; m light-emitting units (where m is an integer of 2 or more) disposed between the first electrode and the second electrode, and including at least one light-emitting layer; and m-1 charge generation layers each interposed between two adjacent light-emitting units of the m light-emitting units; wherein at least one of the m-1 charge generation layers includes a compound represented by Formula 1 below:

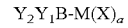

$$Y_2Y_1B\text{-}M(X)_a \qquad \text{Formula 1}$$

wherein:

M is a metal selected from the group consisting of Group 1 metals, Group 2 metals, transition metal, post-transition metals, lanthanides, and actinides, which have a work function of 4.0 eV or less;

X is a halogen element selected from the group consisting of F, Cl, Br, and I;

a is a natural number ranging from 1 to 4; and $Y_1$ and $Y_2$ are the same or different, and are each independently one or more selected from the group consisting of a halogen, a hydroxyl group, a nitro group, a cyano group, an amine group, a $C_1$-$C_{40}$ alkyl group, a $C_6$-$C_{40}$ aryl group, and a 5- to 40-membered heteroaryl group, or they may be bonded to an adjacent group to form a condensed ring, provided that at least one of $Y_1$ and $Y_2$ is a $C_6$-$C_{40}$ aryl group or a 5- to 40-membered heteroaryl group; and wherein the alkyl group, the aryl group, and the heteroaryl group are each unsubstituted or substituted with one or more substituents selected from the group consisting of a halogen, a cyano group, a nitro group, a $C_1$-$C_{40}$ alkyl group, a $C_6$-$C_{40}$ aryl group, a 5- to 40-membered heteroaryl group, a $C_6$-$C_{40}$ aryloxy group, a $C_6$-$C_{40}$ arylphosphine oxide group, and a $C_6$-$C_{40}$ arylamine group, and the substituents may be the same or different if they are plural in number.

The compound represented by formula 1 may be a charge transfer (CT) complex comprising a boron-containing compound and a metal halide.

The content ratio between the boron-containing compound and the metal halide may be 0.5-50:50-95.5 by weight.

The compound represented by formula 1 may be bonded to adjacent compounds of formula 1 to form a cluster, and the cluster may include at least one heterocyclic ring containing the boron and the metal (M).

Each of the m-1 charge generation layers may include at least one host and at least one dopant, and one of the at least one host and at least one dopant may be the compound represented by formula 1.

The m light-emitting units may be disposed alternately with the m-1 charge generation layers, and two light-emitting units of the m light-emitting units may be disposed adjacent to the first electrode and the second electrode, respectively.

Each of the m light-emitting units may include a hole transport region, a light-emitting layer and an electron transport region, the hole transport region may include at least one of a hole injection layer and a hole transport layer, and the electron transport region may include at least one of an electron transport layer and an electron transport layer.

Each of the m-1 charge generation layers may include an n-type charge generation layer and a p-type charge generation layer, the n-type charge generation layer may be disposed adjacent to the electron transport region of each of the m light-emitting units, and the p-type charge generation layer may be disposed adjacent to the hole transport region of each of the m light-emitting units.

The n-type charge generation layer may include a metal selected from the group consisting of Group 1 metals, Group 2 metals, lanthanides, and actinides, which have a work function of 4.0 eV or less.

The p-type charge generation layer may include a metal selected from the group consisting of transition metals and post-transition metals, which have a work function of 4.0 eV or less.

According to another exemplary embodiment of the present disclosure, there is provided a compound for a charge generation layer, including: at least one boron-containing compound; and at least one metal halide containing a metal having a work function of 4.0 eV or less; wherein the boron (B) of the boron-containing compound and the metal (M) of the metal halide are bonded to each other by a one-electron sigma ($\sigma$) bond.

In the compound for the charge generation layer, the bonding value between the metal (M) and boron (B), which is measured by X-ray photoelectron spectrometry (XPS), may range from 180 to 290 eV.

The metal halide may be a metal iodide.

The compound for the charge generation layer may be used for an n-type charge generation layer, a p-type charge generation layer, or both.

The n-type charge generation layer may include a metal selected from the group consisting of Group 1 metals, Group 2 metals, lanthanides, and actinides, which have a work function of 4.0 eV or less.

The p-type charge generation layer may include a metal selected from the group consisting of transition metals and post-transition metals, which have a work function of 4.0 eV or less.

The compound for the charge generation layer may be a charge-transfer (CT) complex comprising a boron-containing compound and a metal halide.

In the compound for the charge generation layer, the content ratio between the boron-containing compound and the metal halide may be 0.5-50:50-95.5 by weight.

The compound for the charge generation layer may be bonded to adjacent compounds of formula 1 to form a cluster, and the cluster may include at least one heterocyclic ring containing the boron and the metal (M).

BRIEF DESCRIPTION OF THE DRAWINGS

A more complete appreciation of the present disclosure will become more apparent by describing in more detail exemplary embodiments thereof with reference to the accompanying drawings, wherein.

DETAILED DESCRIPTION

Features of the present disclosure and methods for achieving them will become apparent from exemplary embodiments described below in more detail in conjunction with the accompanying drawings. However, the present disclosure is not limited to the following exemplary embodiments, but is embodied in various different forms. These exemplary embodiments are provided merely to make the present disclosure complete and fully convey the scope of the present disclosure to a person having ordinary knowledge in the art to which the present disclosure pertains. The present disclosure is defined only by the scope of the attached claims, and equivalents thereof. Therefore, in some exemplary embodiments, well-known process steps, device structures, and technologies are not described in more detail in order to prevent the present disclosure from being obscurely interpreted. Throughout the specification, the same reference symbols refer to the same components.

Unless otherwise defined, all terms used herein (including technical and scientific terms) will have the same meanings as commonly understood by a person having ordinary knowledge in the art to which the present disclosure pertains. Terms, such as those defined in commonly used dictionaries, should not be interpreted in ideal or excessively formal senses unless clearly and particularly defined.

An exemplary embodiment of the present disclosure is directed to a charge-transfer complex compound which may be used as a material for a charge generation layer (CGL).

The charge generation layer (CGL) refers to a layer configured to separate adjacent light-emitting units without being in direct contact with both electrodes (e.g., a first electrode, and a second electrode) in an organic light-emitting diode device including a plurality of light-emitting units. This charge generation layer is disposed between two adjacent light-emitting units, and functions as a cathode (that generates electrodes) for one of the two light-emitting units and as an anode (that generates holes) for the other light-emitting unit. A material for this charge generation layer should have the ability to generate and transfer charges.

A compound for a charge generation layer according to the present disclosure includes: at least one boron-containing compound; and at least one metal halide containing a metal having a work function of 4.0 eV or less. The boron (B) of the boron-containing compound and the metal (M) of the metal halide are bonded to each other by a one-electron sigma bond (a).

Figure 4:
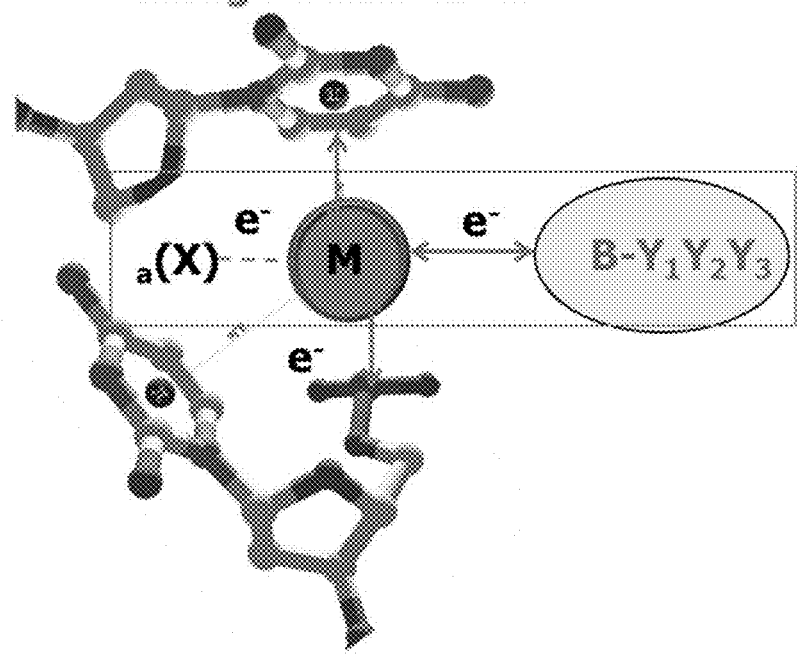
FIG. 4 is a schematic view showing the charge-generation mechanism of a compound for a charge generation layer according to the present disclosure.

As shown in FIG. 4, in the charge-transfer complex compound, a halogen and boron (B) bonded (or connected) to both sides of a metal (M), respectively, all exhibit electron-attracting properties. Accordingly, each of the halogen atom (X) and boron (B) in the molecule functions as an electron acceptor while the metal (M) functions as an electron donor, and thus spontaneous charge polarization between the two atom groups in one molecule occurs leading to charge transfer. When the metal (M) used in the charge-transfer complex compound is an n-type metal having a high Fermi level, charge generation and transfer may be more efficient. Having such charge generation and transfer characteristics, the compound may be a material for a charge generation layer (CGL) in a tandem type (or tandem kind) of light-emitting device.

In the charge-transfer complex compound, the sigma bond between the boron (B) and the metal (M) may be examined by X-ray photoelectron spectrometry (XPS), ultraviolet photoelectron spectrometry (UPS), or the like. For example, in the charge-transfer complex compound of the present disclosure, the bonding value between the metal (M) and the boron (B) may range from 180 to 290 eV, as measured by XPS. Such XPS may be performed under a vacuum condition.

The compound for the charge generation layer may be represented by Formula 1 below:

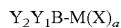  Formula 1 wherein:

M is a metal selected from the group consisting of Group 1 metals, Group 2 metals, transition metal, post-transition metals, lanthanides, and actinides, which have a work function of 4.0 eV or less;

X is a halogen element selected from the group consisting of F, Cl, Br, and I;

a is a natural number ranging from 1 to 4; and $Y_1$ and $Y_2$ are the same or different, and are each independently one or more selected from the group consisting of a halogen, a hydroxyl group, a nitro group, a cyano group, an amine group, a $C_1$-$C_{40}$ alkyl group, a $C_6$-$C_{40}$ aryl group, and a 5- to 40-membered heteroaryl group, or they may be bonded to an adjacent group to form a condensed ring (or a fused ring), provided that at least one of $Y_1$ and $Y_2$ is a $C_6$-$C_{40}$ aryl group or a 5- to 40-membered heteroaryl group.

In this case, the alkyl group, the aryl group, and the heteroaryl group are each unsubstituted or substituted with one or more substituents selected from the group consisting of a halogen, a cyano group, a nitro group, a $C_1$-$C_{40}$ alkyl group, a $C_6$-$C_{40}$ aryl group, a 5- to 40-membered heteroaryl group, a $C_6$-$C_{40}$ aryloxy group, a $C_6$-$C_{40}$ arylphosphine oxide group, and a $C_6$-$C_{40}$ arylamine group, and the substituents may be the same or different if they are plural in number.

In the compound represented by formula 1, $BY_1Y_2$ is a moiety derived from a boron-containing compound, and $M(X)a$ represents a metal halide.

According to an exemplary embodiment of the present disclosure, X in formula 1 may be iodine (I), and the metal (M) may be one or more selected from the group consisting of Li, Na, K, Rb, Cs, Be, Mg, Ca, Sr, Ba, La, Ce, Pr, Nd, Pm, Sm, Eu, Gd, Tb, Dy, Ho, Er, Tm, Yb, Lu; Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W and Zn.

According to another exemplary embodiment of the present disclosure, one of $Y_1$ and $Y_2$ in formula 1 may be a $C_6$-$C_{40}$ aryl group or a 5- to 40-membered heteroaryl group. For example, it may be a 5- to 40-membered heteroaryl group containing at least one N atom, which is a nitrogen-containing group. This nitrogen-containing group makes it possible to control hole mobility.

In this case, the nitrogen-containing group may be a 5-membered aromatic ring group, a 6-membered aromatic ring group, or a 9-membered aromatic ring group including a 5-membered aromatic group fused to a 6-membered aromatic group. In one example, the nitrogen-containing group may be one or more selected from the group consisting of substituents represented by structural formulas below, but is not particularly limited thereto:

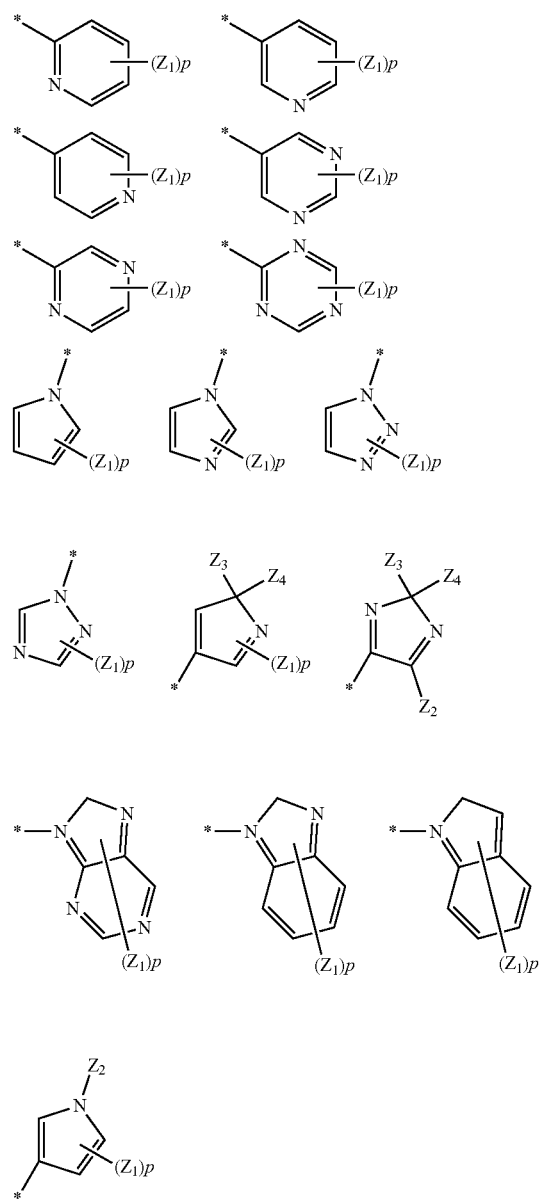

wherein:

$Z_1$ to $Z_4$ are the same or different, and are each independently selected from the group consisting of hydrogen, deuterium, a halogen, a hydroxyl group, a cyano group, a nitro group, an amino group, an amidino group, hydrazine, hydrazone, a carboxyl group, a sulfonic acid group, and a $C_1$-$C_6$ alkyl group; and p is an integer ranging from 1 to 6, and if p is an integer of 2 or more, a plurality of $Z_1$ may be the same or different.

The compound for the charge generation layer according to the present disclosure may be produced using a boron-containing compound and a metal halide according to any suitable method available in the art. In one example, it may be formed by co-depositing a boron-containing compound and a metal halide. In such co-deposition, the mixing ratio between the boron-containing compound and the metal halide is not particularly limited. In one example, the content ratio between the boron-containing compound and the metal halide may be 0.5-50:50-99.5 by weight, for example, 1.0-30:70-99.0 by weight.

In one example, the boron-containing compound and the metal halide may be represented by Formulas 2 and 3 below:

$$B—Y_1Y_2Y_3 \qquad \text{Formula 2}$$

wherein:

$Y_1$ and $Y_2$ are as defined in Formula 1 above; and $Y_3$ is one or more selected from the group consisting of a halogen, a hydroxyl group, a nitrogen group, a cyano group, an amine group, a $C_1$-$C_{40}$ alkyl group, a $C_6$-$C_{40}$ aryl group, and a 5- to 40-membered heteroaryl group.

In this case, the alkyl group, the aryl group, and the heteroaryl group are each unsubstituted or substituted with one or more substituents selected from the group consisting of a halogen, a cyano group, a nitro group, a $C_1$-$C_{40}$ alkyl group, a $C_6$-$C_{40}$ aryl group, a 5- to 40-membered heteroaryl group, a $C_6$-$C_{40}$ aryloxy group, a $C_6$-$C_{40}$ arylphosphine oxide group, and a $C_6$-$C_{40}$ arylamine group, and if the substituents are plural in number, they may be the same or different;

$$M(X)_a \qquad \text{Formula 3}$$

wherein M and a are as defined in Formula 1 above.

When the boron-containing compound of formula 2 and the metal halide of formula 3 are co-deposited, any one (e.g., $Y_3$) of groups constituting the boron-containing compound $[BY_1Y_2Y_3]$ is detached while the boron (B) of the boron-containing compound forms a single sigma (σ) bond with the metal (M) of the metal halide. In this case, although the group which is detached from the boron-containing compound is represented by $Y_3$ for convenience, it is not particularly limited thereto and the kind and position of group which is detached from boron-containing compound may vary Meanwhile, the charge generation layer (CGL) needs to inject or transport electrons into one of two adjacent light-emitting units, and inject or transport holes into the other one. As described above, the charge generation layer includes a charge generation layer having n-type properties (an 'n-type charge generation layer') and a charge generation layer having p-type characteristics (a 'p-type charge generation layer'). Thus, the compound for the charge generation layer according to the present disclosure may be used for an n-type charge generation layer, a p-type charge generation layer, or both. In addition, the compound for the charge generation layer may be used as a host or dopant that constitutes each of the n-type charge generation layer and the p-type charge generation layer.

According to an exemplary embodiment of the present disclosure, the compound of formula 1, which is included in the n-type charge generation layer, may include a first metal ($M_1$) selected from the group consisting of Group 1 metals, Group 2 metals, lanthanides, and actinides, which have a work function of 4.0 eV or less. For example, it may be a first metal iodide, such as, for example, one or more selected from the group consisting of LiI, NaI, KI, RbI, CsI, BeI$_2$, MgI$_2$, CaI$_2$, SrI$_2$, BaI$_2$, YbI, YbI$_2$, YbI$_3$, and SmI$_3$.

According to an exemplary embodiment of the present disclosure, the compound of formula 1, which is included in the p-type charge generation layer, may include a second metal ($M_2$) selected from the group consisting of transition metals and post-transition metals, which have a work function of 4.0 eV or less. For example, it may be a second metal iodide, such as, for example, one or more selected from the group consisting of CuI, TiI, AgI, CdI$_2$, HgI$_2$, SnI$_2$, PbI$_2$, BiI$_3$, ZnI$_2$, MnI$_2$, FeI$_2$, CoI$_2$, NiI$_2$, AlI$_3$, ThI$_4$, and UI$_3$. For example, the compound represented by formula 1 according to the present disclosure may be used for the p-type charge generation layer, because it has an excellent ability to generate and transfer holes.

The above-described compound for the charge generation layer according to the present disclosure may bond with adjacent compounds, for example, compounds of formula 1, and n-type or p-type materials which are used in combination therewith, thereby forming a more stable cluster. This cluster is not particularly limited with respect to its structure. In one example, it may include at least one heterocyclic ring containing the boron and the metal (M), which are located adjacent to each other. In this regard, the heterocyclic ring may refer to a 5- to 40-membered ring containing a heteroatom other than the boron and the metal (M), such as, for example, at least one nitrogen (N) atom.

In one example, the cluster formed from the compound of formula 1 may be represented by any one of Formulas 4 to 7 below, but is not particularly limited thereto:

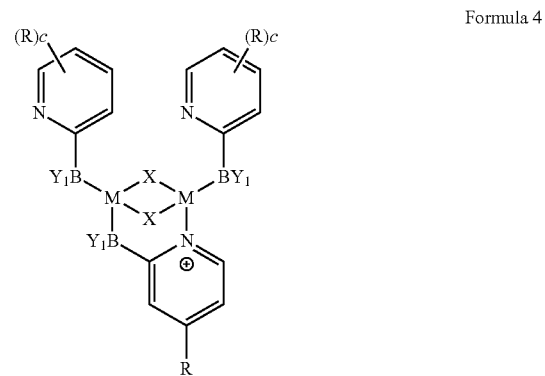

Formula 4

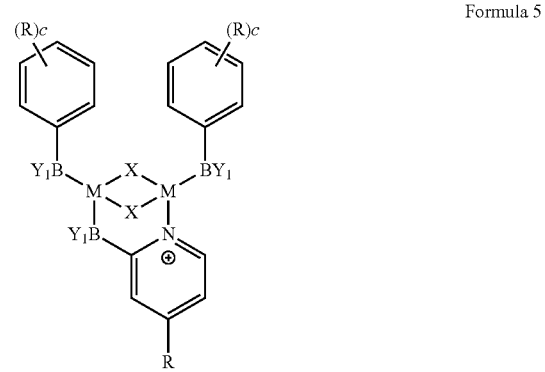

Formula 5

Formula 6

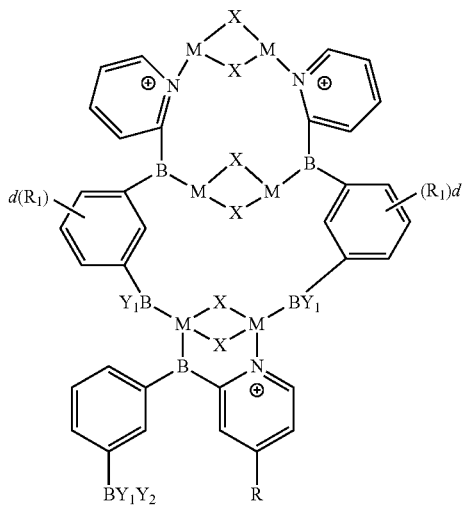

Formula 7

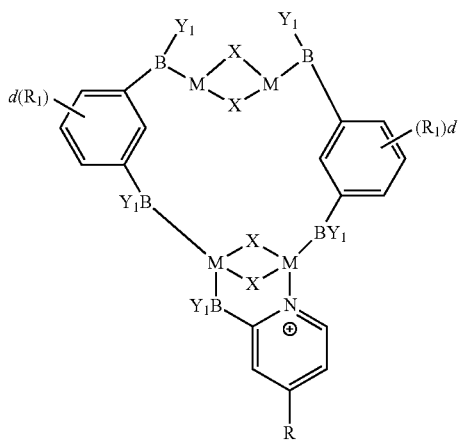

wherein:

R and $R_1$ are the same or different, and are each independently selected from the group consisting of hydrogen, deuterium, a halogen, a cyano group, a nitro group, a $C_1$-$C_{40}$ alkyl group, a $C_6$-$C_{60}$ aryl group, and a 5- to 60-membered heteroaryl group;

the alkyl group, the aryl group, and the heteroaryl group are each substituted with one or more substituents selected from the group consisting of a halogen, a cyano group, a nitro group, a $C_1$-$C_{40}$alkyl group, a $C_6$-$C_{40}$ aryl group, a 5- to 40-membered heteroaryl group, a $C_6$-$C_{40}$ aryloxy group, a $C_6$-$C_{40}$ arylphosphine oxide group, and a $C_6$-$C_{40}$ arylamine group, and substituents may be the same or different if they are plural in number; and c and d are each independently an integer ranging from 1 to 4.

As used herein, the term "alkyl" refers to a monovalent substituent derived from linear or branched saturated hydrocarbon of 1 to 40 carbon atoms, including, for example, methyl, ethyl, propyl, isobutyl, sec-butyl, pentyl, iso-amyl, hexyl, and the like.

As used herein, the term "aryl" denotes a monovalent substituent derived from an aromatic hydrocarbon of 6 to 60 carbon atoms with a single ring or a combination of two or more rings in which two or more rings may simply be pendant to each other or fused together, as exemplified by phenyl, naphthyl, phenanthryl, anthryl, etc.

As used herein, the term "heteroaryl" denotes a monovalent substituent derived from a mono- or polyheterocyclic aromatic hydrocarbon of 5 to 60 nuclear atoms in which at least one, for example, one to three, carbon atoms of the ring are substituted by a heteroatom such as N, O, S or Se. Two or more rings of the heteroaryl, if present, may simply be pendant to each other or fused together or to an aryl group. Examples include 6-membered monocyclic rings such as pyridyl, pyrazinyl, pyrimidinyl, pyridazinyl, and triazinyl, polycyclic rings such as phenoxathienyl, indolizinyl, indolyl, purinyl, quinolyl, benzothiazole, and carbazolyl, 2-furanyl, N-imidazolyl, 2-ixosazolyl, 2-pyridinyl, and 2-pyrimidinyl.

As used herein, the term "condensed ring" or "fused ring" refers to a fused aliphatic ring, a fused aromatic ring, a fused heteroaliphatic ring, a heteroaromatic ring, or a combination thereof.

As described above, the compound represented by formula 1 according to the present disclosure has spontaneous charge transfer characteristics and material stability, due to sigma bond formation between boron and the metal halide, and structural specificity (e.g., a cluster). Accordingly, an organic light-emitting diode device including the above-described compound as the host and/or dopant of the charge generation layer may exhibit the properties of rapidly generating, transferring and separating charges, and thus may exhibit the effect of reducing the driving voltage without affecting the high efficiency and long lifespan characteristics.

Hereinafter, exemplary embodiments of the present disclosure will be described with reference to the accompanying drawings.

Figure 1:
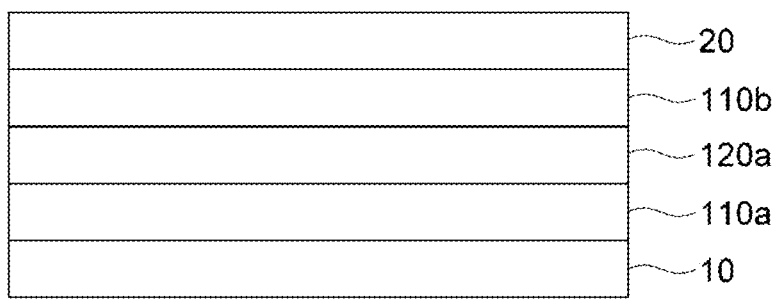
FIG. 1 is a cross-sectional view showing the structure of an organic light-emitting diode device according to an exemplary embodiment of the present disclosure.
Figure 2:
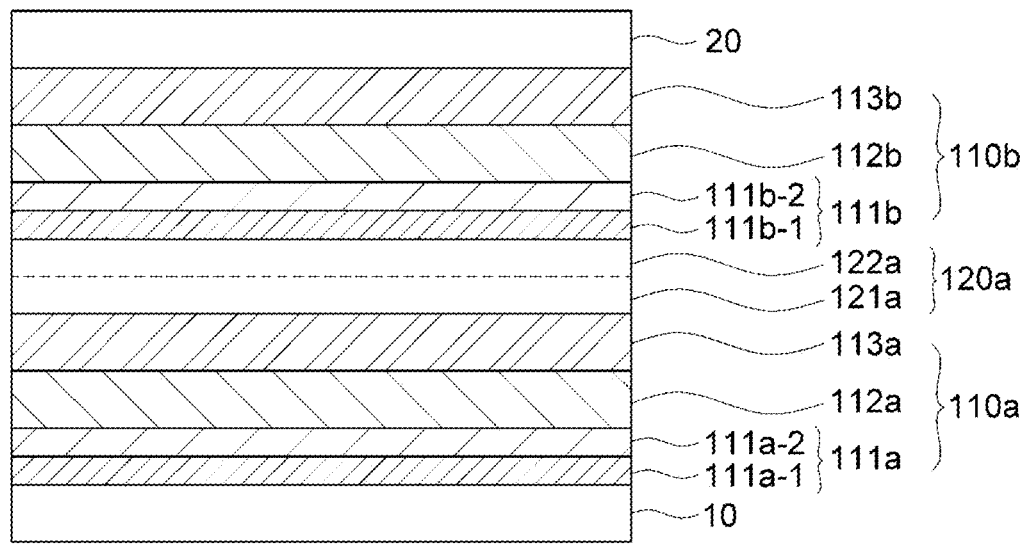
FIG. 2 is an enlarged cross-sectional view showing the structure of the organic light-emitting diode device shown in FIG. 1.
Figure 3:
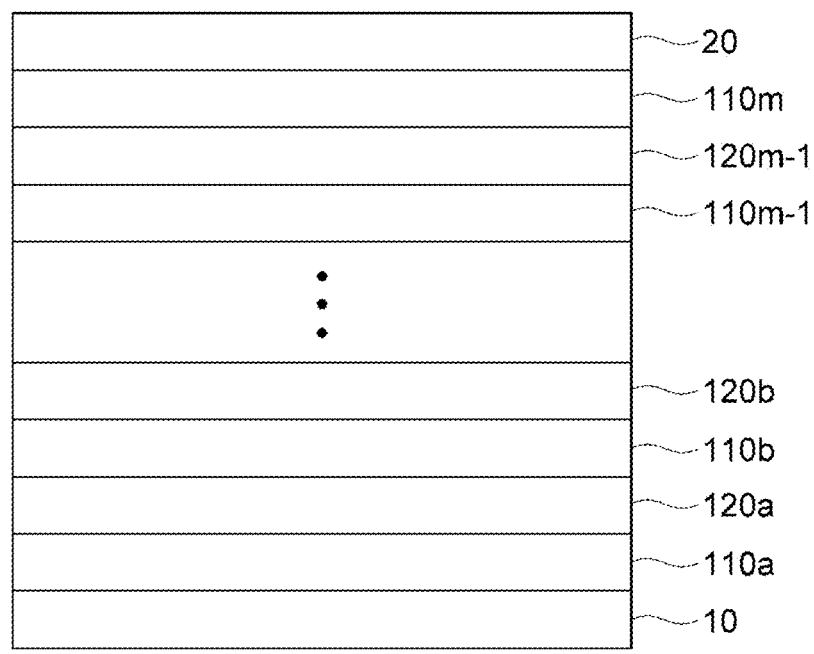
FIG. 3 is a cross-sectional view showing the structure of an organic light-emitting diode device according to another exemplary embodiment of the present disclosure.

FIGS. 1-3 are cross-sectional views schematically showing the structure of an organic light-emitting diode device including at least one charge generation layer (CGL).

The organic light-emitting diode device may include: a first electrode; a second electrode disposed opposite to the first electrode; m light-emitting units (where m is an integer of 2 or more) disposed between the first electrode and the second electrode, and including at least one light-emitting layer; and m-1 charge generation layers each interposed between two adjacent light-emitting units of the m light-emitting units.

In this case, m may be an integer of 2 or more, for example, 2 to 10, 2 to 4, 2 or 3. An exemplary embodiment of an organic light-emitting diode device, where m is 2, refers to FIGS. 1-2, and an exemplary embodiment of an organic light-emitting diode device, where m is 3 or more, refers to FIG. 3.

FIGS. 1-2 are cross-sectional views schematically showing the structure of an organic light-emitting diode device 100 according to a first exemplary embodiment of the present disclosure.

Referring to FIG. 1, the organic light-emitting diode device 100 includes a single charge generation layer (CGL). For example, it includes a first electrode 10, a second electrode 20, a first light-emitting unit 110a, a second light-emitting unit 110b, and a charge generation layer 120a. In this case, the light-emitting unit refers to a unit having a function of emitting light, and includes at least one light-emitting layer that emits color light having a set (e.g., specific) wavelength.

Hereinafter, each component of the organic light-emitting diode device will be described in more detail.

First Electrode

The first electrode 10 is disposed on a substrate, and is electrically coupled to (e.g., electrically connected to) a driving thin film transistor so that it may receive a driving current from the driving thin film transistor. This first electrode 10 may include a material having a relatively high work function, and thus functions as an anode that injects holes into a hole transport region 111a adjacent thereto. In this case, the second electrode 20 disposed opposite to the first electrode 10 functions as a cathode that injects electrons into an electron transport region 113b adjacent thereto. However, the present disclosure is not limited thereto, and in some cases, the first electrode 10 may function as a cathode, and the second electrode 20 may function as an anode.

When the organic light-emitting diode device 100 is of a bottom emission type (or bottom emission kind), the first electrode 10 may include a material, such as ITO, IZO, ZnO or $In_2O_3$, or a stack including two or more of these materials.

On the other hand, when the organic light-emitting diode device 100 is of a top emission type (or top emission kind), the first electrode 10 may further include a silver (Ag)-based reflective layer having high reflectivity. According to one exemplary embodiment, the first electrode 10 has an at least two-layer structure including a sliver (Ag)-based reflective layer and a transparent conductive layer disposed on the reflective layer. According to another exemplary embodiment, the first electrode 10 has a three-layer structure including a transparent conductive layer (a 'first transparent conductive layer'), a reflective layer and a transparent conductive layer (a 'second transparent conductive layer'). In the first electrode having the three-layer structure, the first transparent conductive layer substantially functions as an anode electrode, and the second transparent conductive layer functions to control work function.

The silver (Ag)-based reflective layer may be a silver (Ag) or silver (Ag) reflective layer. In this regard, the silver alloy may include at least one metal selected from among magnesium (Mg), gold (Au), calcium (Ca), lithium (Li), chromium (Cr), copper (Cu), palladium (Pd), platinum (Pt), nickel (Ni), and aluminum (Al). This silver (Ag)-based reflective layer may have a thickness ranging from about 50 nm to about 100 nm.

The transparent conductive layer may include a transparent material having a relatively high work function, such as, for example, a transparent conductive oxide (TCO). Non-limiting examples of the transparent conductive oxide include ITO (Indium Tin Oxide), IZO (Indium Zinc Oxide), ZnO (Zinc Oxide), AZO (Aluminum Zinc Oxide), $In_2O_3$ (Indium Oxide), $SnO_2$ (Tin Oxide), and the like, which may be used alone or as a mixture of two or more thereof. This transparent conductive layer may have a thickness ranging from about 2 nm to about 10 nm, for example, a thickness of about 4 nm to 7 nm.

The first electrode 10 may be formed by a sputtering method, a deposition method, or the like, or any other suitable method available in the art. In one example, it may be formed by a sputtering process using a fine metal mask (FMM).

Second Electrode

The second electrode 20 may be disposed opposite to the first electrode 10. The second electrode 20 may include a material having a relatively low work function. This second electrode 20 functions as a cathode that injects electrons into an electron transport region 113b of a light-emitting unit adjacent thereto.

The second electrode 20 includes silver (Ag) or a silver-containing material. It may include a silver-containing material. This second electrode 20 may be a (semi)transparent electrode that may provide an organic light-emitting diode device having a top emission-type (or top emission kind) of structure. Examples of the silver-containing material include alloys of silver (Ag) with at least one metal selected from among magnesium (Mg), lithium (Li) calcium (Ca), chromium (Cr), copper (Cu), palladium (Pd), platinum (Pt), nickel (Ni), and aluminum (Al).

The second electrode 20 may have a thickness ranging from about 5 nm to about 20 nm. In view of a reduction in device thickness as well as electrode supply function, the second electrode 20 may have a thickness ranging from about 10 nm to 15 nm.

Like the above-described first electrode, the second electrode 20 may be formed by a sputtering method, a deposition method, or the like, or any other suitable method available in the art.

First Light-Emitting Unit

The first light-emitting unit 110a is interposed between the first electrode 10 and the second electrode 20. For example, it may be in direct contact with the first electrode 10.

The first light-emitting unit 110a includes at least one first light-emitting layer 112a that emits light having a set (e.g., specific) wavelength. If necessary or desired, it may further include any suitable organic layer available in the art. For example, the first light-emitting unit 110a includes a first hole transport region 111a, a first light-emitting layer 112a, and a first electron transport region 113a.

First Hole Transport Region

The first hole transport region 111a is disposed on the first electrode 10, and functions to transport holes, injected from the first electrode 10, to the first light-emitting layer 112a. This first hole transport region 111a includes one or more selected from a hole injection layer 111a-1 and a hole transport layer 111a-2, and if necessary or desired, it may further include any suitable buffer layer available in the art.

The first hole injection layer 111a-1 may include any suitable hole transport material available in the art, and may, if necessary or desired, include a p-type dopant.

Non-limiting examples of hole injection materials that may be used include phthalocyanine compounds such as copper phthalocyanine; DNTPD (N,N'-diphenyl-N,N'-bis-[4-(phenyl-m-tolyl-amino)-phenyl]-biphenyl-4,4'-diamine), m-MTDATA (4,4',4"-tris(3-methylphenylphenylamino)triphenylamine), TDATA (4,4'4"-tris(N,N-diphenylamino)triphenylamine), 2-TNATA (4,4',4"-tris{N,-(2-naphthyl)-N-phenylamino}-triphenylamine), PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/camphor sulfonic acid), PANI/PSS (polyaniline)/poly(4-styrenesulfonate)), and the like. These may be used alone or as a mixture of two or more thereof.

The p-dopant may be any suitable dopant available in the art, and is not particularly limited. Examples of the p-dopant include quinone derivatives, such as tetrahydroquinonedimethane (TCNQ), 2,3,5,6-tetrafluoro-tetracyano-1,4-benzoquinonemethane (F4TCNQ) and the like; metal oxides, such as tungsten oxide, molybdenum oxide, rhenium oxide and the like; metal iodides, such as copper iodide, bismuth iodide and the like, hexaazatriphenylene-hexacarbonitrile (HAT-CN), and the like.

The first hole transport layer 111a-2 may be disposed on the above-described first hole injection layer 111a-1. For example, the first hole transport layer 111a-2 may be in direct contact with the first hole injection layer 111a-1. The first hole transport layer 111a-2 may receive holes from the first hole injection layer 111a-1.

The first hole transport layer 111a-2 may include any suitable hole transport material available in the art. Non-limiting examples of hole transport materials that may be used include carbazole-based derivatives, such as phenyl carbazole, polyvinyl carbazole and the like; fluorine-based derivatives; triphenylamine-based derivatives, such as TPD (N,N'-bis(3-methylphenyl)-N,N'-diphenyl-[1,1-biphenyl]-4,4'-diamine), TCTA (4,4',4"-tris(N-carbazolyl)triphenylamine) and the like; NPB (N,N'-di(1-naphthyl)-N,N'-diphenylbenzidine), TAPC (4,4'-cyclohexylidene bis[N,N-bis(4-methylphenyl)benzenamine]), and the like. These may be used alone or as a mixture of two or more thereof. If necessary or desired, the first hole transport layer 111a-2 may include a p-type dopant.

First Light-Emitting Layer

The first light-emitting layer 112a is disposed on the first hole transport region 111a. For example, it is located between the first hole transport region 111a and the first electron transport region 113a. This light-emitting layer 112a may receive holes from the first hole transport region 111a and receive electrons from the first electron transport region 113a. The holes and electrons supplied as described above combine to form excitons in the first light-emitting layer 112a. When the energy level of these excitons changes from an excitation state to a ground state, light having a color corresponding to the changed energy level may be emitted.

The first light-emitting layer 112a may emit light having a first wavelength. The light color emitted from the first light-emitting layer 112a is not particularly limited, and may vary depending on the material forming the first light-emitting layer 112a. Examples of the light color include blue, green, red, yellow, white, and the like. This first light-emitting layer 112a may include materials that emits red, green, blue, yellow and white light colors, and it may be formed using phosphorescent or fluorescent materials.

In one embodiment, the first light-emitting layer 112a may include two or more light-emitting layers. These two or more light-emitting layers may emit a light color having the same (e.g., substantially the same) wavelength. In some embodiments, the first light-emitting layer 112a may include a plurality of layers that emit lights having different wavelengths. For example, it may be provided to include different light-emitting dopants.

The first light-emitting layer 112a includes a host, and may optionally further include a dopant. When the first light-emitting layer 112a includes a host and a dopant, the content of the dopant may range from about 0.01 to about 25 parts by weight, such as, for example, from about 0.01 to about 15 parts by weight, based on 100 parts by weight of the host, but is not limited thereto.

The host may be any suitable host available in the art, and is not particularly limited. Examples of the host include, but are not limited to, Alq$_3$ (tris(8-quinolinolato)aluminum), CBP (4,4'-bis(N-carbazolyl)-1,1'-biphenyl), PVK (poly(N-vinylcarbazole), AND (9,10-di(naphthalene-2-yl)anthracene, TCTA (4,4',4"-tris(carbazol-9-yl)-triphenylamine, TPBI(1,3,5-tris(N-phenylbenzimidazole-2-yl)benzene, TBADN (3-tert-butyl-9,10-di(naphth-2-yl)anthracene, DSA (distyrylarylene), E3 or CDBP (4,4'-bis(9-carbazolyl)-2,2'-dimethyl-biphenyl), and the like.

The dopant may be any suitable dopant available in the art, and is not particularly limited. Such dopants may be classified into fluorescent dopants, and phosphorescent dopants. The phosphorescent dopants may be metal complexes including Ir, Pt, Os, Re, Ti, Zr, Hf, or a combination of two or more thereof, but are not limited thereto.

Meanwhile, such dopants may be classified into red dopants, green dopants, and blue dopants. Suitable red dopants, green dopants, and blue dopants, available in the art, may be used without particular limitation.

For example, non-limiting examples of the red dopant include PtOEP (Pt(II) octaethylporphyrin), Ir(piq)$_3$ (tris(2-phenylisoquinoline)iridium), Btp$_2$Ir(acac) (bis(2-(2'-benzothienyl)-pyridinato-N,C3')iridium(acetylacetonate), and the like, which may be used alone or as a mixture of two or more thereof.

Furthermore, non-limiting examples of the green dopant include Ir(ppy)$_3$ (tris(2-phenylpyridine)iridium), Ir(ppy)$_2$(acac) (bis(2-phenylpyridine)(acetylacetonato)iridium(III)), Ir(mppy)$_3$ (tris(2-(4-tolyl)phenylpiridine)iridium), C545T (10-(2-benzothiazolyl)-1,1,7,7-tetramethyl-2,3,6,7-tetrahydro-1H,5H,11H-[1]benzopyrano[6,7,8-ij]-quinolizin-11-one), and the like, which may be used alone or as a mixture of two or more thereof.

Furthermore, non-limiting examples of the blue dopant include F$_2$Irpic (bis[3,5-difluoro-2-(2-pyridyl)phenyl](picolinato)iridium(III)), (F$_2$ppy)$_2$Ir(tmd), Ir(dfppz)$_3$, DPVBi (4,4'-bis(2,2'-diphenylethen-1-yl)biphenyl) DPAVBi (4,4'-bis[4-(diphenylamino)styryl]biphenyl), TBPe (2,5,8,11-tetra-tert-butylperylene), and the like, which may be used alone or as a mixture of two or more thereof.

The light-emitting layer 112a may have a single-layer structure including one type (or kind) of material, a single-layer structure including a plurality of different materials, or a multi-layer (at least two-layer) structure having a plurality of layers including different materials. When the light-emitting layer 112a includes a plurality of layers, the organic light-emitting diode may emit light having various suitable colors. Furthermore, when the light-emitting layer includes a plurality of layers, the driving voltage of the device may increase, but the current value in the organic light-emitting diode device may become constant, and thus the organic light-emitting diode device may have luminous efficiency that is improved by the number of the light-emitting layers.

First Electron Transport Region

The first electron transport region 113a is disposed on the first light-emitting layer 112a, and functions to transport electrons, injected from a charge generation layer 120a to be described below, to a first light-emitting layer 112a adjacent thereto.

The first electron transport region 113a includes one or more selected from the group consisting of an electron transport layer and an electron injection layer. In one example, the first electron transport region 113a may include a first electron transport layer, or may include a first electron transport layer and a first electron injection layer.

The first electron transport layer includes any electron transport material available in the art. It may, if necessary or desired, include an n-type dopant. Non-limiting examples of electron transport materials that may be used include oxazole-based compounds, isoxazole-based compounds, triazole-based compounds, isothiazole-based compounds, oxadiazole-based compounds, thiadiazole-based compounds, perylene-based compounds, pyrene-based compounds, triazine-based compounds, anthracene-based compounds, aluminum complexes (e.g., Alq3 (tris(8-quinolinolato)-aluminum), BAlq, SAlq, and Almq3), gallium complexes (e.g., Gaq'2OPiv, Gaq'2OAc, 2(Gaq'2)), and the like. These may be used alone or a mixture of two or more thereof.

The first electron injection layer may be disposed on the above-described first electron transport layer. For example, it may be in direct contact with the first electron transport layer.

The first electron injection layer may include any suitable electron injection material available in the art. Non-limiting examples of electron injection materials that may be used include LiF, LiQ, NaQ, $Li_2O$, BaO, NaCl, CsF; lanthanide metals, such as Yb and the like; and metal halides, such as RbCl, RbI, and the like, which may be used alone or a mixture of two or more thereof.

Second Light-Emitting Unit

The second light-emitting unit 110b is interposed between the first light-emitting unit 110a 10 and the second electrode 20. For example, it may be in direct contact with the second electrode 20.

The second light-emitting unit 110b includes at least one second light-emitting layer 112a that emits light having a set (e.g., specific) wavelength. If necessary or desired, it may further include any suitable organic layer available in the art. For example, the second light-emitting unit 110b includes a second hole transport region 111b, a second light-emitting layer 112b, and a second electron transport region 113b.

Second Hole Transport Region

The second hole transport region 111b is disposed on a charge generation layer 120a to be described below, and functions to transport holes, injected from the charge generation layer 120a, such as, for example, the p-type charge generation layer 122a, to an adjacent second light-emitting layer 112b. This second hole transport region 111b includes one or more selected from a second hole injection layer 111b-1 and a second hole transport layer 111b-2, and may, if necessary or desired, further include any suitable buffer layer available in the art.

The second hole injection layer 111b-1 and the second hole transport layer 111b-2 are not particularly limited, and may include any suitable hole injection material and any suitable hole transport material, respectively, available in the art. If necessary or desired, a p-type dopant may be used. In one example, each of the second hole injection layer 111b-1 and the second hole transport layer 111b-2 may be configured in substantially the same manner as the above-described first hole transport region 111a.

Second Light-Emitting Layer

The second light-emitting layer 112b is disposed on the second hole transport region 111b. For example, it is located between the second hole transport region 111b and the second electron transport region 113b. This second light-emitting layer 112b may receive holes from the second hole transport region 111b, and receive electrons from the second electron transport region 113b. The holes and electrons supplied as described above combine to form excitons in the second light-emitting layer 112b. When the energy level of these excitons changes from an excitation state to a ground state, light having a color corresponding to the changed energy level may be emitted.

The second light-emitting layer 112b may emit light having a second wavelength. The light color emitted from the second light-emitting layer 112b is not particularly limited, and may vary depending on the material forming the second light-emitting layer 112b. Examples of the light color include blue, green, red, yellow, white, and the like. This second light-emitting layer 112b may include materials that emits red, green, blue, yellow and white light colors, and it may be formed using phosphorescent or fluorescent materials.

In one embodiment, the second light-emitting layer 112b may include two or more light-emitting layers. These two or more light-emitting layers may emit a light color having the same (e.g., substantially the same) wavelength. In some embodiments, the second light-emitting layer 112b may include a plurality of layers that emit light having different wavelengths. For example, it may be provided to include different light-emitting dopants.

According to an exemplary embodiment of the present disclosure, the first light-emitting unit 112a of the first light-emitting unit 110a and the second light-emitting unit 112b of the second light-emitting unit 110b may be light-emitting layers that emit light having different colors or that emit light having the same (e.g., substantially the same) color. In this case, the colors displayed by the light-emitting layers 112a and 112b may be in complementary color relation. In addition, the color may be selected as a combination of colors capable of displaying white, and these light-emitting layers 112a and 112b may include phosphorescent dopants corresponding to selected colors, respectively.

The second light-emitting layer 112b is not particularly limited, and it includes a host, and may optionally further include a dopant.

Second Electron Transport Region

The second electron transport region 113b is disposed on the second light-emitting layer 112b, and functions to transport electrons, injected from a second electrode 120 to be described below, to the second light-emitting layer 112b adjacent thereto.

The second electron transport region 113b includes one or more selected from the group consisting of an electron transport layer and an electron injection layer. In one example, the second transport region 113b may include a second electron transport layer. In another example, it may include a second electron transport layer and a second electron injection layer.

The second electron transport layer and the second electron injection layer are not particularly limited, and may include any suitable electron transport material and any suitable electron injection material, respectively, available in the art. If necessary or desired, an n-type dopant may be used. In one example, each of the second electron transport layer and the second electron injection layer may be configured in substantially the same manner as the above-described first electron transport region 113a.

Charge Generation Layer

The charge generation layer 120a is interposed between the first light-emitting unit 110a and the second light-emitting unit 110b. For example, the charge generation layer 120a may be located between the first electron transport region 113a of the first light-emitting unit 110a and the second hole transport region 111b of the second light-emitting region 110b. For example, it may be in direct contact with the first electron injection layer of the first light-emitting unit 110a and with the second hole injection layer 111b-1 of the second light-emitting unit 110b.

The charge generation layer 120a may include an n-type charge generation layer 121a and a p-type charge generation layer 122a. The n-type charge generation layer 121a and the p-type charge generation 122a may come into direct contact with each other to form an NP junction. The NP junction enables electrons and holes to be generated concurrently (e.g., simultaneously) between the n-type charge generation layer 121a and the p-type charge generation layer 122a. Referring to the exemplary embodiment shown in FIGS. 1-2, the generated electrons are transferred to the first light-emitting unit 110a among two adjacent light-emitting units through the n-type charge generation layer 121a, and the generated holes are transferred to the second light-emitting unit 110a among two adjacent light-emitting units through the p-type charge generation layer 122a.

The charge generation layer 120a may be formed by doping an n-type material and/or a p-type material into an organic material. For example, the n-type charge generation layer 121a may be formed by doping an n-type material into an organic material to facilitate electron supply, and the p-type charge generation layer 122a may be formed by doping a p-type material into an organic material to facilitate hole supply.

According to an exemplary embodiment of the present disclosure, at least one of the n-type charge generation layer 121a and the p-type charge generation layer 122a includes the above-described charge transfer complex compound represented by formula 1.

The compound of formula 1, included in the n-type charge generation layer 121a, includes a first metal ($M_1$) selected from the group consisting of Group 1 metals, Group 2 metals, lanthanides, and actinides, which are metals (M) having a work function of 4.0 eV or less. For example, it includes an iodide of the first metal.

In addition, the compound of formula 1, included in the p-type charge generation layer 122a, includes a second metal ($M_2$) selected from the group consisting of transition metals and post-transition metals, which are metals (M) having a work function of 4.0 eV or less. For example, it includes an iodide of the second metal.

The compound represented by formula 1 according to the present disclosure may be for the p-type charge generation layer, because it has an excellent ability to generate and transfer holes.

The charge generation layer 120a of the present disclosure is not particularly limited with respect to its component, structure, thickness and the like, as long as it includes the compound represented by formula 1. In one example, the charge generation layer 120a may be either a mono-layer including the compound of formula 1, which is formed by co-depositing a boron compound and a metal halide, or a mono-layer including a mixture of the compound of formula 1 and at least one different material. In some embodiments, the charge generation layer 120a may be a multi-layer structure having a plurality of layers formed by depositing two or more different materials. In this case, the compound represented by formula 1 may be a host material for forming the n-type charge generation layer 121a or the p-type charge generation layer 122a, or may be used as a dopant material.

When the compound of formula 1 is used as a dopant material for the n-type charge generation layer 121a or the p-type charge generation layer 122a, the amount used thereof may be suitably adjusted within any suitable range of doping amount generally used in the art. In one example, the compound represented by formula 1 may be used in an amount of 0.5 to 50 wt %, for example, 0.5 to 20 wt %, based on the total weight of the charge generation layer.

A material that may be used in combination with the compound of formula 1 to form the charge generation layer 120a is not limited, and may be any suitable n-type or p-type charge generation material available in the art. This n-type material used may be a nitrate, carbonate, phosphate, quinolate, halide or chalcogenide-based compound containing an alkali metal, an alkaline earth metal or a general metalloid. In one example, the n-type material may be any one selected from the group consisting of $Li_2CO_3$, Liq, $LiN_3$, $Rb_2CO_3$, $AgNO_3$, $Ba(NO_3)_2$, $Mn(NO_3)_2$, $Zn(NO_3)_2$, $CsNO_3$, $Cs_2CO_3$, CsF, $CsN_3$, CuI, $CuBr_2$, $CuCl_2$, $BiI_3$, $BiBr_3$, $BiCl_3$, Te, YbTe and the like. In addition, p-type materials include phthalocyanine compounds, such as copper phthalocyanine, starburst-type (or starburst kind) of amine derivatives, such as TCTA or m-MTDATA, conductive polymers, and the like.

In addition to the above-described n-type charge generation layer 121a and p-type charge generation layer 122a, the charge generation layer 120a of the present disclosure may, if necessary or desired, further include a third layer.

For example, the n-type charge generation layer 121a and p-type charge generation layer 122a of the charge generation layer 120a are stacked adjacent to each other, a depletion region may be formed by combination of the electrons and holes generated therein. In this case, as the potential difference applied to the charge generation layer 120a increase, the depletion region is enlarged. If the depletion region is enlarged, a problem may arise in that a driving voltage for driving the organic light-emitting diode device increases. For this reason, the charge generation 120a of the present disclosure may further include, between the n-type charge generation layer 121a and the p-type charge generation layer 122a, a depletion-preventing layer for preventing (or reducing) the formation of the depletion region. The depletion-preventing layer may include any suitable material available in the art to prevent (or reduce) the formation of the depletion region. In one example, it may include a carbon allotrope, such as carbon nanotubes (CNTs), graphene or the like.

In addition, the organic light-emitting diode device according to the present disclosure may further include a charge balancing layer, which is capable of controlling the number and speed of charges that move to the first light-emitting unit 110a and the second light-emitting unit 110b, on a region adjacent to the charge generation layer 120a. Namely, because the movement speed of holes is generally higher than the movement speed of electrons, the charge balancing layer may reduce the speed of holes or increase the speed of electrons, thereby achieving the hole-electron balance, with the result that the efficiency of generation of excitons is increased.

In the present disclosure, the thickness of the charge generation layer 120a is not particularly limited, and may be suitably adjusted within any suitable range generally used in the art. In one example, it may range from about 5 nm to about 30 nm. When the thickness of the charge generation layer 120a is in this range, suitable or satisfactory hole transport characteristics and a proper amount of charges can be obtained without substantially increasing the driving voltage.

The charge generation layer 120a may be formed using any suitable method available in the art. Examples of the method include, but are not limited to, a vacuum deposition method, a spin coating method, a cast method, a Langmuir-Blodgett (LB) method, an inkjet printing method, a laser printing method, a laser-induced thermal imaging (LITI) method, and the like. For example, the method may be a vacuum deposition method.

Meanwhile, FIG. 3 is a cross-sectional view schematically showing the structure of an organic light-emitting diode device 200 according to a second exemplary embodiment of the present disclosure.

In the following description on FIG. 3, contents overlapping with those of FIGS. 1-2 will not be described again, but only differences will be described.

An exemplary embodiment of the organic light-emitting diode device shown in FIG. 3 includes at least two more (m-1) charge generation layers compared to that shown in FIGS. 1-2.

For example, the organic light-emitting diode device 200 includes m light-emitting unit 110a, 110b, 110m-1 and 110m, and m-1 charge generation layers 120a, 120b and 120m-1. In this case, m may be an integer of 2 or more. In one example, m may be 2 to 10, for example, 2 to 4, 2 or 3.

Each of the m-1 charge generation layers 120a, 120b and 120m-1 includes one n-type charge generation layer and one p-type charge generation layer. Accordingly, the organic light-emitting diode device 200 including the m-1 charge generation layers includes m-1 n-type charge generation layers and m-1 p-type charge generation layers. The n-type charge generation layers are disposed adjacent to the electron transport regions of them light-emitting units 110a, 110b, 110m-1 and 110m, and the p-type charge generation layers are disposed adjacent to the hole transport regions of them light-emitting units 110a, 110b, 110m-1 and 110m.

In the present disclosure, the m-1 charge generation layers 120a, 120b and 120m-1 may include the same material or different materials. For example, the m-1 charge generation layers 120a, 120b and 120m-1 each includes at least one host and at least one dopant. One of the at least one host and dopant may be the compound for the charge generation layer, which is represented by formula 1.

Them light-emitting units 110a, 110b, 110m-1 and 110m) are disposed alternately with the m-1 charge generation layers 120a, 120b and 120m-1. Among these m light-emitting units 110a, 110b, 110m-1 and 110m, two light-emitting units 110a and 110m are disposed adjacent to the first electrode 10 and the second electrode 20, respectively.

Each of them light-emitting units 110a, 110b, 110m-1 and 110m includes a hole transport region, a light-emitting layer and an electron transport region.

Each of the m hole transport regions included in the m light-emitting units includes at least one of a hole injection layer and a hole transport layer. For example, the hole transport region may include only the hole injection layer, or include both the hole injection layer and the hole transport layer.

In addition, each of the m electron transport regions included in the m light-emitting units includes at least one of an electron transport layer and an electron injection layer. In one example, each electron transport region includes only the electron transport layer. In another example, each electron transport region may include both the electron transport layer and the electron injection layer.

Them light-emitting units 110a and 110b may include light emitting layers 112a and 112b that emit light having different colors. In some embodiments, these m light-emitting units may also include light emitting layers 112a and 112b that emit light having the same (e.g., substantially the same) color. In this case, the colors displayed by the light-emitting layers may be in complementary color relation. In addition, the color may be selected as a combination of colors capable of displaying white, and these light-emitting layers may include phosphorescent dopants corresponding to selected colors, respectively.

The organic light-emitting diode device of the present disclosure, which includes the above-described configuration, may be provided in a flat panel display device including a transistor. For example, according to the present disclosure, there is provided a flat panel display device including: a transistor including a source electrode, a drain electrode, a gate electrode and an active layer; and the organic light-emitting diode device including the charge generation layer, wherein the first electrode of the organic light-emitting diode device is electrically coupled to (e.g., electrically connected to) one of the source electrode and the drain electrode. For example, the flat panel display device may be an organic light-emitting display device.

The active layer of the transistor may be selected from various suitable material layers, such as an amorphous silicon layer, a crystalline silicon layer, an organic semiconductor layer, an oxide semiconductor layer, and the like.

Since the flatpanel display device includes the tandem-type (or tandem kind) of organic light-emitting diode device, it can exhibit effects, such as low driving voltage, improved efficiency, high stability and long lifespan characteristics. Accordingly, this display device has excellent luminous efficiency, and may be advantageously applied to flexible organic light-emitting display devices that have recently attracted a lot of attention in the display field, as well as lighting devices.

Hereinafter, the present disclosure will be described in further detail with reference to examples. However, these examples are intended to illustrate the present disclosure, and the scope of the present disclosure is not limited to these examples.

Example 1: Fabrication of Organic Light-Emitting Diode Device Formation of Hole Transport Region A glass substrate having formed thereon a 15 Ω/cm² (120 nm) ITO (Corning) as an anode was cut to a size of 50 mm×50 mm×0.5 mm, and washed by ultrasonic cleaning for 15 minutes with each of acetone, isopropyl alcohol, and purified water. Next, the glass substrate was irradiated with UV light for 30 minutes, washed by exposure to ozone, and then placed in a vacuum deposition system.

On the ITO anode, m-TDATA and F4-TCNQ (3 wt %) were co-deposited to form a 20 nm-thick hole injection layer. Next, on the hole injection layer, NPB was deposited to form a 150 nm-thick hole transport layer, thereby forming a hole transport region.

Formation of First Light-Emitting Unit

On the hole transport region, ADN and DPAVBi (5 wt %) were co-deposited to form a 20 nm-thick light-emitting layer. Next, on the light-emitting layer, Bphen was deposited to form a 30 nm-thick electron transport (ET)-auxiliary light emitting layer, thereby forming a first light-emitting unit.

Formation of Charge Generation Layer

On the first light-emitting unit, a phenanthroline host and Li (2 wt %) were co-deposited to form a 10 nm-thick n-type charge generation layer. Next, on n-type charge generation layer, a boron-containing compound represented by Formula 8 below and a metal halide ($BiI_3$, bismuth iodide) were co-deposited at a weight ratio of 50:50 (1:1), and a silver (Ag)- or tellurium (Te)-based chalcogenide having a 15 nm thickness and a low work function value was formed to be of a p-type, thereby forming a p-type charge generation layer.

Formula 8

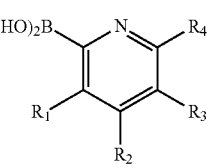

wherein $R_1$ to $R_4$ are each a methyl group.

Formation of Second Light-Emitting Unit

On the charge generation layer, a 30 nm-thick hole transport (HT)-auxiliary light emitting layer was formed. Next, on the HT-auxiliary light emitting layer, CBP and PYD (15 wt %) were co-deposited to form a 30 nm-thick light-emitting layer. On the light-emitting layer, Bphen was deposited to form a 10 nm-thick ET-auxiliary light emitting layer, thereby forming a second light-emitting unit.

Formation of Electron Transport Region and Second Electrode

On the second light-emitting unit, Bphen and LiQ (1:1 w/w) were co-deposited to form a 30 nm thick electron transport layer. On the electron transport layer, LiQ was deposited to form a 1 nm thick electron injection layer. Next, on the electron injection layer, Al was deposited to form a 200 nm thick second electrode (cathode), thereby fabricating an organic light-emitting diode device.

Example 2: Fabrication of Organic Light-Emitting Diode Device

An organic light-emitting diode device of Example 2 was fabricated in substantially the same manner as described in Example 1, except that the charge generation layer was formed using the boron-containing compound and the metal halide at a weight ratio of 20:80.

Comparative Example 1: Fabrication of Organic Light-Emitting Diode Device

An organic light-emitting diode device of Comparative Example 1 was fabricated in substantially the same manner as described in Example 1, except that the boron-containing compound was not used in the charge generation layer.

Test Example 1: Evaluation of Physical Properties of Organic Light-Emitting Devices The driving voltage characteristics of the organic light-emitting diode devices fabricated in Examples 1 and 2 and Comparative Example 1 were measured, and the results of the measurement are shown in FIG. 5.

Figure 5:
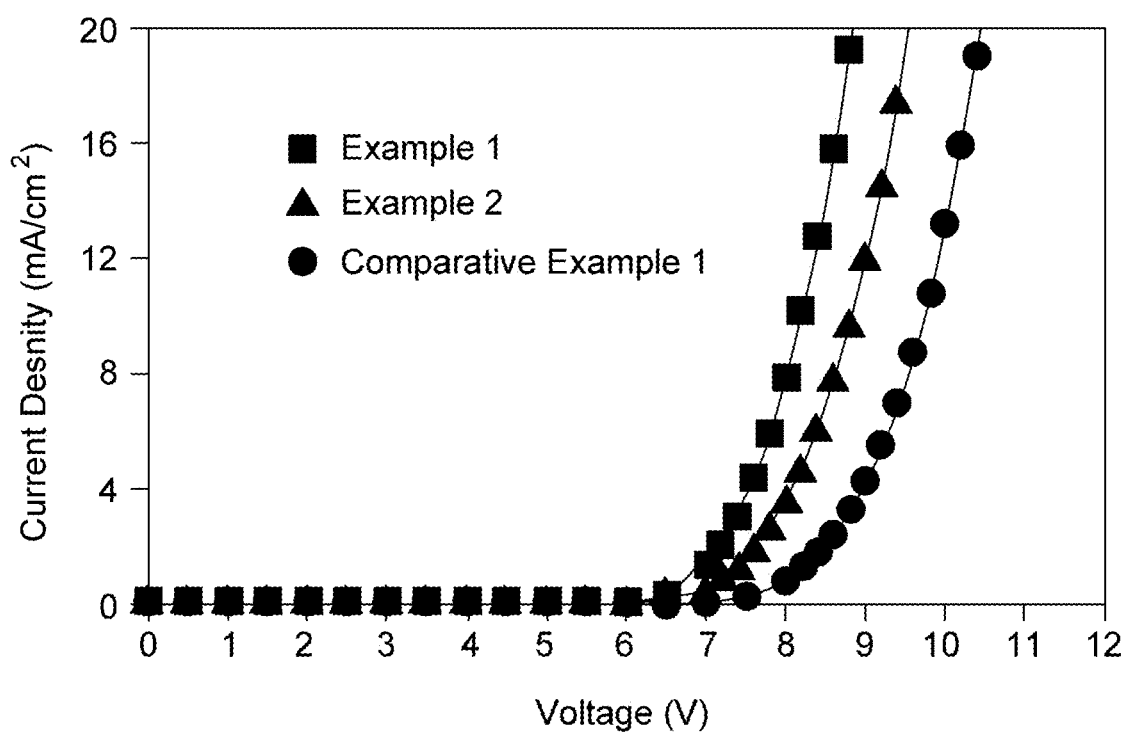
FIG. 5 is a graph showing changes in the driving voltages of organic light-emitting diode devices fabricated in Examples 1 and 2 and Comparative Example 2.

The test results indicated that the driving voltages of the organic light-emitting diode devices fabricated in Examples 1 and 2 of the present disclosure were significantly lower than that of the organic light-emitting diode device of Comparative Example 1, while the efficiency characteristics thereof were not reduced (see FIG. 5).

As described above, the organic light-emitting diode device according to the exemplary embodiment of the present disclosure includes the charge generation layer having an excellent ability to generate and transfer charges. Accordingly, the organic light-emitting diode device including a plurality of stacked light-emitting units may exhibit low driving voltage, high efficiency, and long lifespan characteristics at the same (e.g., substantially the same) time.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the exemplary embodiments of the present disclosure have been described with reference to the accompanying drawings, it will be appreciated by a person having ordinary knowledge in the art to which the present disclosure pertains that the present disclosure may be practiced in other specific forms without changing the technical spirit and essential feature of the present disclosure. Therefore, it should be understood that the above-described embodiments are illustrative but not limitative in all aspects.

What is claimed is:

1. An organic light-emitting diode device comprising:
   a first electrode;
   a second electrode disposed opposite to the first electrode;
   m light-emitting units (where m is an integer of 2 or more) disposed between the first electrode and the second electrode, and comprising at least one light-emitting layer; and
   m-1 charge generation layers each interposed between two adjacent light-emitting units of the m light-emitting units;
   wherein at least one of the m-1 charge generation layers comprises a compound represented by Formula 1 below:

$Y_2Y_1B\text{-}M(X)_a$ 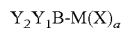 Formula 1 wherein:
   M is a metal selected from the group consisting of Group 1 metals, Group 2 metals, transition metals, post-transition metals, lanthanides, and actinides, which have a work function of 4.0 eV or less;
   X is a halogen element selected from the group consisting of F, Cl, Br, and I;
   a is a natural number ranging from 1 to 4; and
   $Y_1$ and $Y_2$ are the same or different, and are each independently one or more selected from the group consisting of a halogen, a hydroxyl group, a nitro group, a cyano group, an amine group, a $C_1$-$C_{40}$ alkyl group, a $C_6$-$C_{40}$ aryl group, and a 5- to 40-membered heteroaryl group, or they may be bonded to an adjacent group to form a condensed ring, provided that at least one of $Y_1$ and $Y_2$ is a $C_6$-$C_{40}$ aryl group or a 5- to 40-membered heteroaryl group; and
   wherein the alkyl group, the aryl group, and the heteroaryl group are each unsubstituted or substituted with one or more substituents selected from the group consisting of a halogen, a cyano group, a nitro group, a $C_1$-$C_{40}$ alkyl group, a $C_6$-$C_{40}$ aryl group, a 5- to 40-membered heteroaryl group, a $C_6$-$C_{40}$ aryloxy group, a $C_6$-$C_{40}$ arylphosphine oxide group, and a $C_6$-$C_{40}$ arylamine group, and the substituents may be the same or different if they are plural in number.

2. The organic light-emitting diode device of claim 1, wherein the compound represented by formula 1 is a charge-transfer (CT) complex comprising a boron-containing compound and a metal halide.

3. The organic light-emitting diode device of claim 2, wherein a content ratio between the boron-containing compound and the metal halide is 0.5-50:50-95.5 by weight.

4. The organic light-emitting diode device of claim 1, wherein the compound represented by formula 1 is bonded to adjacent compounds of formula 1 to form a cluster, and the cluster comprises at least one heterocyclic ring containing the boron and the metal (M).

5. The organic light-emitting diode device of claim 1, wherein each of the m-1 charge generation layers comprises at least one host and at least one dopant, and one of the at least one host and at least one dopant is the compound represented by formula 1.

6. The organic light-emitting diode device of claim 1, wherein the m light-emitting units are disposed alternately with the m-1 charge generation layers, and two light-emitting units of the m light-emitting units are disposed adjacent to the first electrode and the second electrode, respectively.

7. The organic light-emitting diode device of claim 1, wherein:
   each of the m light-emitting units comprises a hole transport region, a light-emitting layer, and an electron transport region;
   the hole transport region comprises at least one of a hole injection layer and a hole transport layer; and
   the electron transport region comprises at least one of an electron transport layer and an electron transport layer.

8. The organic light-emitting diode device of claim 1, wherein:
   each of the m-1 charge generation layers comprises an n-type charge generation layer and a p-type charge generation layer;
   the n-type charge generation layer is disposed adjacent to the electron transport region of each of the m light-emitting units; and
   the p-type charge generation layer is disposed adjacent to the hole transport region of each of the m light-emitting units.

9. The organic light-emitting diode device of claim 8, wherein the n-type charge generation layer comprises a metal selected from the group consisting of Group 1 metals, Group 2 metals, lanthanides, and actinides, which have a work function of 4.0 eV or less.

10. The organic light-emitting diode device of claim 8, wherein the p-type charge generation layer comprises a metal selected from the group consisting of transition metals and post-transition metals, which have a work function of 4.0 eV or less.

11. A compound for a charge generation layer, comprising:
    at least one boron-containing compound; and
    at least one metal halide containing a metal having a work function of 4.0 eV or less;
    wherein the boron (B) of the boron-containing compound and the metal (M) of the metal halide are bonded to each other by a one-electron sigma bond.

12. The compound of claim 11, wherein a bonding value between the metal (M) and the boron (B), which is measured by X-ray photoelectron spectrometry (XPS), ranges from 180 to 290 eV.

13. The compound of claim 11, wherein the compound is represented by Formula 1 below:

$Y_2Y_1B\text{-}M(X)_a$  Formula 1 wherein:
    M is a metal selected from the group consisting of Group 1 metals, Group 2 metals, transition metals, post-transition metals, lanthanides, and actinides, which have a work function of 4.0 eV or less;

X is a halogen element selected from the group consisting of F, Cl, Br, and I;

a is a natural number ranging from 1 to 4; and $Y_1$ and $Y_2$ are the same or different, and are each independently one or more selected from the group consisting of a halogen, a hydroxyl group, a nitro group, a cyano group, an amine group, a $C_1$-$C_{40}$ alkyl group, a $C_6$-$C_{40}$ aryl group, and a 5- to 40-membered heteroaryl group, or they may be bonded to an adjacent group to form a condensed ring, provided that at least one of $Y_1$ and $Y_2$ is a $C_6$-$C_{40}$ aryl group or a 5- to 40-membered heteroaryl group; and wherein the alkyl group, the aryl group, and the heteroaryl group are each unsubstituted or substituted with one or more substituents selected from the group consisting of a halogen, a cyano group, a nitro group, a $C_1$-$C_{40}$ alkyl group, a $C_6$-$C_{40}$ aryl group, a 5- to 40-membered heteroaryl group, a $C_6$-$C_{40}$ aryloxy group, a $C_6$-$C_{40}$ arylphosphine oxide group, and a $C_6$-$C_{40}$ arylamine group, and the substituents may be the same or different if they are plural in number.

14. The compound of claim 11, wherein the metal halide is a metal iodide.

15. The compound of claim 11, wherein the compound is used for an n-type charge generation layer, a p-type charge generation layer, or both.

16. The compound of claim 15, wherein the n-type charge generation layer comprises a metal selected from the group consisting of Group 1 metals, Group 2 metals, lanthanides, and actinides, which have a work function of 4.0 eV or less.

17. The compound of claim 15, wherein the p-type charge generation layer comprises a metal selected from the group consisting of transition metals and post-transition metals, which have a work function of 4.0 eV or less.

18. The compound of claim 11, wherein the compound is a charge-transfer (CT) complex comprising a boron-containing compound and a metal halide.

19. The compound of claim 18, wherein a content ratio between the boron-containing compound and the metal halide is 0.5-50:50-95.5 by weight.

20. The compound of claim 13, wherein the compound represented by formula 1 is bonded to adjacent compounds of formula 1 to form a cluster, and the cluster comprises at least one heterocyclic ring containing the boron and the metal (M).

* * * * *